(12) United States Patent
Lund

(10) Patent No.: US 9,825,189 B2
(45) Date of Patent: Nov. 21, 2017

(54) DUAL-MODE PHOTOSENSITIVE PIXEL WITH GAIN STAGE

(71) Applicant: Sensors Unlimited, Inc., Princeton, NJ (US)

(72) Inventor: Joshua Lund, Dallas, TX (US)

(73) Assignee: Sensors Unlimited, Inc., Princeton, NJ (US)

( * ) Notice: Subject to any disclaimer, the term of this patent is extended or adjusted under 35 U.S.C. 154(b) by 239 days.

(21) Appl. No.: 14/684,021

(22) Filed: Apr. 10, 2015

(65) Prior Publication Data

US 2016/0300961 A1   Oct. 13, 2016

(51) Int. Cl.
*H01J 43/00* (2006.01)
*H01L 31/02* (2006.01)
*H04N 5/355* (2011.01)
*H04N 5/3745* (2011.01)

(52) U.S. Cl.
CPC ... *H01L 31/02016* (2013.01); *H04N 5/35518* (2013.01); *H04N 5/35527* (2013.01); *H04N 5/3745* (2013.01)

(58) Field of Classification Search
CPC ............ H01L 31/02016; H04N 5/3745; H04N 5/35518; H04N 5/35527
USPC .................. 250/214, 214 A, 214 L, 214 LA
See application file for complete search history.

(56) References Cited

U.S. PATENT DOCUMENTS

| 5,929,434 A * | 7/1999 | Kozlowski | H01L 27/14634 250/214 A |
|---|---|---|---|
| 6,243,182 B1 * | 6/2001 | Wang | H04B 10/1121 398/119 |
| 6,965,270 B1 * | 11/2005 | Ross | H03F 1/223 330/291 |
| 2002/0024058 A1 * | 2/2002 | Marshall | H01L 27/14609 257/170 |
| 2003/0042406 A1 * | 3/2003 | Charbon | G01J 1/46 250/214 A |
| 2015/0381914 A1 * | 12/2015 | Terryn | H03F 3/085 348/302 |

* cited by examiner

*Primary Examiner* — Thanh Luu
*Assistant Examiner* — Kevin Wyatt
(74) *Attorney, Agent, or Firm* — Snell & Wilmer L.L.P.

(57) ABSTRACT

A photosensitive pixel with gain stage is disclosed. The photosensitive pixel with gain stage may receive an input light stimulus and output a corresponding output voltage in response to the input light stimulus. The output voltage may correspond linearly to the magnitude of the input light stimulus over a linear operating region and logarithmically to the magnitude of the input light stimulus over a logarithmic operating region. In this manner, the photosensitive pixel with gain stage may be both sensitive to input light stimuli over the linear operating region and may exhibit dynamic range enabling non-saturated response to input light stimuli over the logarithmic operating region.

13 Claims, 2 Drawing Sheets

DUAL-MODE PHOTOSENSITIVE PIXEL WITH GAIN STAGE

FIELD

The present disclosure relates generally to systems and methods for photosensitive pixels with gain stage, and more specifically to photosensitive pixels with gain stage with linear and logarithmic output modes.

BACKGROUND

Photosensitive pixels are frequently used in devices that detect light stimuli. For instance, photosensitive pixels may be used in devices that detect light stimuli of various intensities. For instance, some light stimuli are often very weak, whereas others are often very strong. A photosensitive pixel may be implemented to detect the light stimuli and amplify a resultant electronic signal. However, many such photosensitive pixels are configured for sensitivity to weak stimuli or for tolerance to strong stimuli, hindering the functioning of such photosensitive pixels under a variety of operating circumstances and providing inadequate sensitivity and/or inadequate dynamic range.

SUMMARY

The forgoing features and elements may be combined in various combinations without exclusivity, unless expressly indicated herein otherwise. These features and elements as well as the operation of the disclosed embodiments will become more apparent in light of the following description and accompanying drawings.

A photosensitive pixel with gain stage is disclosed. The photosensitive pixel with gain stage may include a photodetector module configured to receive an input light stimulus and induce a detection current into a detection node in response to the magnitude of the input light stimulus, a current mirror module including a mirrored current node and configured to induce a mirrored current on the mirrored current node in response to the detection current, and a mode threshold control module including an output node and configured to induce at a current on the output node corresponding to a combination of the magnitude of the input light stimulus and an amplifier mode.

A photosensitive pixel with gain stage may include a photodetector module configured to receive an input light stimulus and induce a detection current into a detection node in response to a magnitude of the input light stimulus, a current mirror module having a mirrored current node and configured to induce a mirrored current on the mirrored current node in response to the detection current, and a mode threshold control module with an output node and configured to induce a current on the output node corresponding to a combination of the magnitude of the input light stimulus and an amplifier mode. The photodetector module may include a detector configured to detect the magnitude of the input light stimulus, a bias control amplifier connected to the detector, and a bias control transistor connected to the bias control amplifier and configured to induce the detection current into the detection node in response to the magnitude of the input light stimulus. The detector may include a reverse biased light sensitive diode having an anode and a cathode. The amplifier mode may include at least one of a linear integral correlation to the magnitude of the input light stimulus and a logarithmic correlation to the magnitude of the input light stimulus, and wherein the current mirror module has two n-channel field effect transistors.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice embodiments of the disclosure, it should be understood that other embodiments may be realized and that logical changes and adaptations in design and construction may be made in accordance with this invention and the teachings herein. Thus, the detailed description herein is presented for purposes of illustration only and not limitation. The scope of the disclosure is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Furthermore, any reference to singular includes plural embodiments, and any reference to more than one component or step may include a singular embodiment or step. Surface shading lines may be used throughout the figures to denote different parts but not necessarily to denote the same or different materials.

As mentioned throughout, an input light stimulus may be in form of electromagnetic radiation. For example, the input light stimulus may be a light stimulus. In various embodiments, the input light stimulus is a collimated light stimulus, such as laser light. In further embodiments, the input light stimulus is any type of electromagnetic radiation, such as gamma rays, ultraviolet light, infrared light, X rays, or any other electromagnetic radiation.

Figure 1:
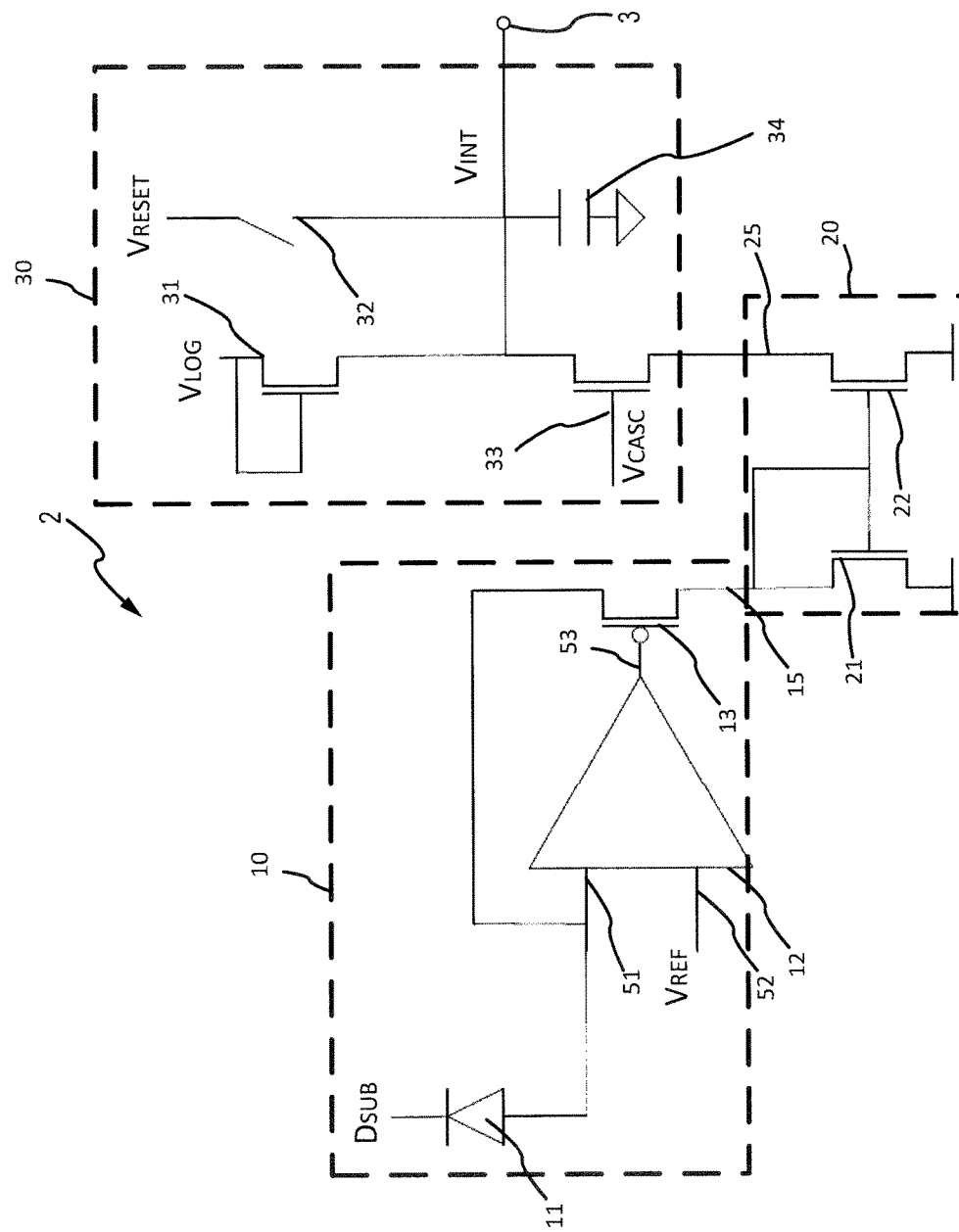
FIG. 1 illustrates a dual-mode photosensitive pixel with gain stage according to various embodiments.
Figure 2:
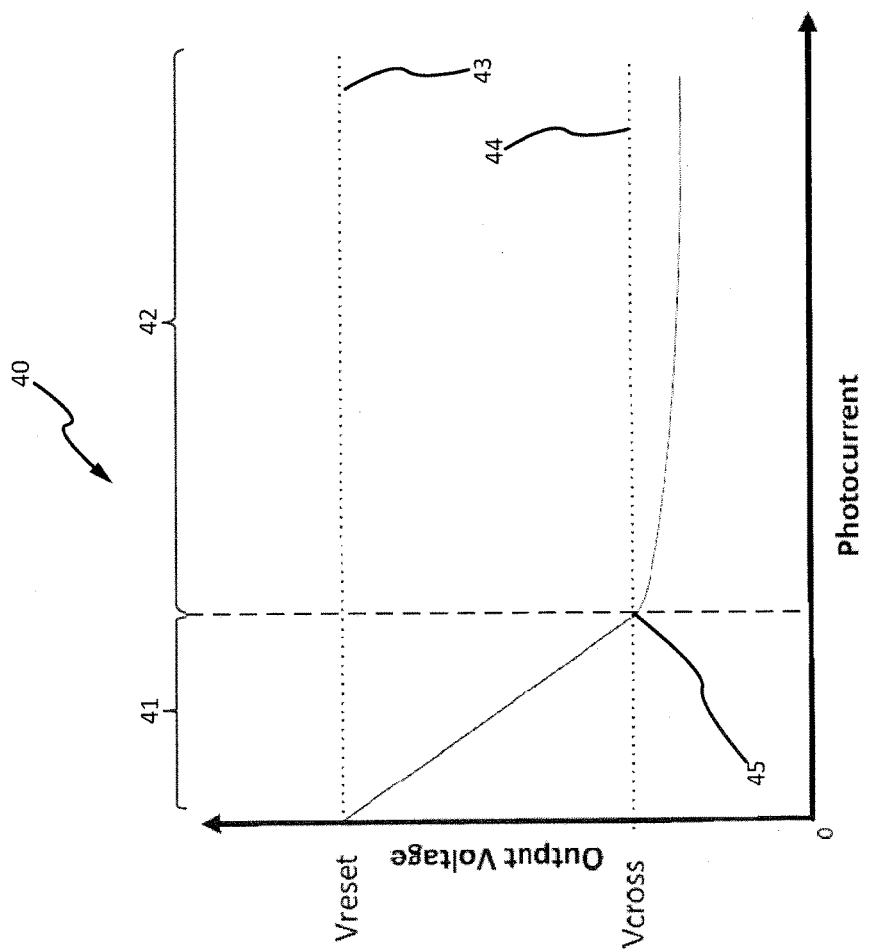
FIG. 2 illustrates example behavior of a dual-mode photosensitive pixel with gain stage according to various embodiments.

With reference to FIGS. 1 and 2, an example dual-mode photosensitive pixel with gain stage 2 is disclosed (FIG. 1) and various circuit behaviors 40 of the dual-mode photosensitive pixel with gain stage 2 are disclosed (FIG. 2). A dual-mode photosensitive pixel with gain stage 2 may be a modified dual-mode current amplifier architecture disclosed herein. As such, the dual-mode photosensitive pixel with gain stage 2 may comprise a photodetector module 10, a current mirror module 20, and a mode threshold control module 30.

A photodetector module 10 may receive an input light stimulus 8 and may establish a detection current into a detection node 15 of the photodetector module 10. Similarly, the current mirror module 20 may monitor the detection node 15 and may further induce a mirrored current on a mirrored current node 25. The mirrored current may be amplified or attenuated relative to the detection current on detection node 15 The mirrored current may be sinked/sourced from a mode threshold control module 30. In response to the magnitude of the mirrored current, the mode threshold control module 30 may provide an output voltage on an output node 3. The output voltage may vary in response to the mirrored current at least one of linearly and logarithmically, depending on the instantaneous mode of operation of the dual-mode photosensitive pixel with gain stage 2. More specifically, output node 3 is reset to an initial voltage, $V_{RESET}$. The mirrored current at mirrored current node 25 will sink charge from output node 3 and the voltage at output node 3 will decrease until a threshold is met. The dual-mode photosensitive pixel with gain stage 2 will be operating in a linear (integrating) mode. After the threshold (inflection point 45 on FIG. 2) is met, the output voltage at output node 3 will be a substantially instantaneous function of the mirrored current on mirrored current node 25. Thus, the dual-mode photosensitive pixel with gain stage 2 will be operating in a logarithmic (substantially instantaneous) mode.

A photodetector module 10 may comprise a detector 11, a bias control amplifier 12, and a bias control transistor 13. The photodetector module 10 may receive the input light stimulus 8 and induce a detection current in the detection node 15 in response.

A detector 11 may comprise an optical detection device. For instance, the detector 11 may comprise a light sensing diode having an anode and a cathode. The light sensing diode may be reverse biased by a voltage, $D_{SUB}$, and may conduct an illumination response current in response to the presence of an input light stimulus 8.

A bias control amplifier 12 may comprise an operational amplifier or any other amplifier device. For instance, the bias control amplifier 12 may be electrically connected in series with the detector 11. The bias control amplifier 12 may have a first input 51, a second input 52, and an output 53. The detector 11 may be connected to the first input 51. A bias control transistor 13 may also be connected in series with the detector 11, such as along a drain-source path of the bias control transistor 13, and the bias control transistor 13 may be connected to the output 53 of the bias control amplifier 12. For instance, the gate of the bias control transistor 13 may be connected to the output 53 of the bias control amplifier 12, thus the drain-source path of the bias control transistor 13 and the first input 51 of the bias control amplifier 12 may be connected in parallel. The bias control amplifier 12 may receive a reference voltage, $V_{REF}$, such as at the second input 52, and may induce an output 53 in response to a first comparison of the first input 51 and the second input 52. For instance, the first comparison may comprise the voltage received from the detector 11 being greater than or less than/equal to $V_{REF}$. In further embodiments, the first comparison may comprise the voltage received from the detector 11 being greater than/equal to or less than $V_{REF}$. For instance, the induced output 53 might may toggle between relatively higher and lower voltages/ currents and/or impedances. For instance, in response to the voltage received from the detector 11 being less than $V_{REF}$ (e.g., first comparison), the output 53 of the bias control amplifier 12 may be induced to a lowered voltage. The resistivity of the drain-source path of the bias control transistor 13 may change in response. More specifically, the bias control amplifier 12 may monitor the first input 51 (connected to detector 11) and provide a negative feedback path to control the impedance of bias control transistor 13 in response to the detector current at first input 51, such that the first input 51 connected to detector 11 may always be biased as a reference voltage, $V_{REF}$.

A bias control transistor 13 may comprise a field-effect transistor (FET). The bias control transistor 13 may comprise a P-channel FET as illustrated in FIG. 1. However, in further embodiments, the bias control transistor 13 may comprise an N-channel FET, or may comprise any transistor as desired.

The bias control transistor 13 may comprise a P-channel FET having a gate, drain, and source. The gate may be connected to the output of the bias control amplifier 12 so that the bias control amplifier 12 provides feedback inducing the resistivity of the drain-source path to change. For, instance, when the output of the bias control amplifier 12 is transitions to a lower voltage, the resistivity of the drain-source path may also transition to a lower resistivity, such as according to a ratio of the change in drain current to the change in gate voltage over a defined interval (e.g., according to the transconductance of the FET).

The source of the bias control transistor 13 may be connected in series with the detector 11. In this manner, the current flowing from the detector 11, may pass through the source-drain path of the bias control transistor 13, subject to the effect of feedback from the bias control amplifier 12. The current flowing through the drain-source path may be varied by the detector 11, for instance, in response to the magnitude of the input light stimulus 8. This current may exit the bias control transistor 13 via detection node 15.

The current mirror module 20 may comprise a current mirror transistor connected to detection node 15. The current mirror module 20 may receive the detection current present at detection node 15 and may draw a corresponding mirrored current at mirrored current node 25. The corresponding mirrored current at mirrored current node 25 may be amplified and/or attenuated relative to the detection current at detection node 15.

The current mirror module 20 may comprise a first current mirror transistor 21 and a second current mirror transistor 22. The first current mirror transistor 21 may receive a current from detection node 15. The first current mirror transistor 21 may interoperate with a second current mirror transistor 22 to induce a mirrored current on the mirrored current node 25 that corresponds to the current at the detection node 15.

A first current mirror transistor 21 and/or a second current mirror transistor 22 may comprise a field-effect transistor (FET). The first current mirror transistor 21 and/or second current mirror transistor 22 may each comprise an N-channel FET as illustrated in FIG. 1. However, in further embodiments, the first current mirror transistor 21 and/or second current mirror transistor 22 may each comprise a P-channel FET, or may comprise any transistor as desired.

A mode threshold control module 30 may comprise a current integrator 34, a cascode limit transistor 33, and logarithmic current amplifier 31, and an integration reset switch 32. For instance, the mode threshold control module 30 may be connected to the mirrored current node 25 of the current mirror module 20. Thus a current may be impelled through at least a portion of the mode threshold control module 30 (e.g., the mirrored current), the current corresponding to that detector current passing through the detection node 15 of the current mirror module 20, which corresponds to the illumination response current flowing from the detector 11, such that, the mirrored current impelled through at least a portion of the mode threshold control module 30 corresponds to the magnitude of the input light stimulus 8. The mode threshold control module 30 may induce a corresponding voltage on output node 3. This voltage may be related to the magnitude of the input light stimulus 8 by various mathematical relations. For instance, the mode threshold control module 30 may alternately induce a voltage on output node 3 that is linearly related to the integrated value of the input light stimulus 8 over the time duration from when integration reset switch 32 is operated to when output node 3 voltage is observed, and at other times, induce a voltage on output node 3 that is logarithmically related to the substantially instantaneous magnitude of the input light stimulus 8.

The mode threshold control module 30 may comprise a current integrator 34. A current integrator 34 may comprise a capacitor with a component value of $C_{INT}$. The current integrator 34 may be disposed between an output node 3 and a circuit ground. Thus, the current integrator 34 may integrate the current flowing into the current integrator 34 and produce an output voltage that comprises the integral of the current over the time duration from when the integration reset switch 32 is operated to when output node 3 voltage is observed. In various embodiments, the current integrator 34 integrates the current flowing into the current integrator 34 and produces a corresponding output voltage over the linear region 41 (FIG. 2) of operation of the dual-mode photosensitive pixel with gain stage 2.

A cascode limit transistor 33 may be disposed in connection to the mirrored current node 25 and may be configured to enhance the linearity of response of the dual-mode photosensitive pixel with gain stage 2 over the linear region 41 (FIG. 2). The source voltage of the cascode limit transistor 33 may be set in response to $V_{CASC}$. This, in turn, maintains a constant drain voltage on second current mirror transistor 22, improving the linearity of the voltage response when operating in linear integrating mode.

The voltage $V_{log}$ at the drain of logarithmic current amplifier 31 may be used to set a threshold for the mode transition from linear response to logarithmic response. The threshold may correspond to an output voltage at output node 3 that crosses a mode transition point (inflection point 45 (FIG. 2)) comprising the transition point wherein an output voltage on one side of the mode transition point is a linear function of light stimulus integrated from the time an integration reset switch 32 is operated (e.g., opened) and an output voltage on the other side of the threshold is a logarithmic function of the instantaneous light stimulus. The voltage present at output node 3 at the mode transition point (inflection point 45 (FIG. 2)) may be called $V_{CROSS}$. Thus, stated differently, the amplifier mode may comprise a logarithmic correlation to the magnitude of the input light stimulus in response to the magnitude of the input light stimulus causing an output voltage on the output node to exceed $V_{CROSS}$ and a linear function of the magnitude of the input light stimulus integrated over a first period (e.g., from the time an integration reset switch 32 is operated, for example, is opened) in response to the magnitude of the input light stimulus causing an output voltage on the output node to not exceed $V_{CROSS}$.

In various embodiments, $V_{CROSS}$ may be mathematically determined according to component parameters, such that the transition of the dual-mode photosensitive pixel with gain stage 2 from linear to logarithmic modes may be predicted. For instance:

$$V_{CROSS} = V_{RESET} - \frac{I_{PHOTO} \cdot t_{int}}{C_{INT}} = V_{log} - V_T \cdot \ln\frac{I_{PHOTO}}{I_0}$$

$V_T$ represents the threshold voltage of logarithmic current amplifier 31 in the cases where it is implemented as an NFET transistor. A cascode limit transistor 33 may comprise a field-effect transistor (FET). The cascode limit transistor 33 may comprise an N-channel FET as illustrated in FIG. 1. However, in further embodiments, the cascode limit transistor 33 may comprise a P-channel FET, or may comprise any transistor as desired. $I_{PHOTO}$ represents the mirrored photocurrent seen at the drain of current mirror transistor 22. $I_0$ is a constant parameter quantifying the current-carrying capacity of logarithmic current amplifier 31. $t_{int}$ represents the integration time, which is the time from when the integration reset switch 32 is opened until the voltage at output node 3 is observed. $C_{int}$ represents the capacitance of the current integrator 34.

A logarithmic current amplifier 31 may be disposed in connection to the cascode limit transistor 33 and a voltage source, $V_{log}$. The logarithmic current amplifier 31 may interoperate further with the cascode limit transistor 33 to compel inflection point 45 (FIG. 2) and further to impel a logarithmic relation between output voltage at output node 3 and the magnitude of the input light stimulus 8 over logarithmic region 42 (FIG. 2). In various embodiments, the logarithmic current amplifier 31 comprises an N-channel FET with the gate and source connected together, and wherein the source-drain path extends in series from a voltage source, $V_{log}$ to output node 3 and further in series with the drain-source path of cascode limit transistor 33. In further embodiments, the logarithmic current amplifier 31 may comprise a P-channel FET or any suitable device as desired.

Finally, integration reset switch 32 may be disposed between output node 3 (the shared node of the current integrator 34 and the cascode limit transistor 33) and a voltage source, $V_{RESET}$. Integration reset switch 32 may be selectably induced to reset the integration of the current passing into the current integrator 34 and further may drive the output node 3 to a voltage equal to $V_{RESET}$ such as depicted by reset boundary 43 of FIG. 2. Thus, with additional reference to FIG. 2, the dual-mode photosensitive pixel with gain stage 3 may 1) produce an output at output node 3 corresponding to, $V_{RESET}$ in response to no input light stimulus 8 being detected by detector 11, 2) produce an output corresponding linearly to the magnitude of input light stimulus 8 across linear region 41 in response to the magnitude of the input light stimulus 8 being insufficient to cause the output voltage on output node 3 to reach $V_{CROSS}$ (inflection point 45), and 3) produce an output corresponding logarithmically to the substantially instantaneous magnitude of input light stimulus 8 across logarithmic region 42 in response to the magnitude of the input light stimulus 8 being sufficient to cause the output voltage on output node 3 to reach/exceed $V_{CROSS}$ (inflection point 45). The dual-mode photosensitive pixel with gain stage 2 may produce an output at output node 3 that reflects a difference relative to $V_{log}$ that is a logarithmic function of the substantially instantaneous mirrored current through logarithmic region 42. As such, a dual-mode photosensitive pixel with gain stage 2 may have a configurable gain and a configurable linear-mode/logarithmic mode transition point (e.g., inflection point 45 of FIG. 2).

Various benefits and advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A photosensitive pixel with gain stage comprising:
   a photodetector module configured to receive an input light stimulus and induce a detection current into a detection node in response to a magnitude of the input light stimulus;
   a current mirror module comprising a mirrored current node and configured to induce a mirrored current on the mirrored current node in response to the detection current; and
   a mode threshold control module comprising an output node and configured to induce a current on the output node corresponding to a combination of the magnitude of the input light stimulus and an amplifier mode,
   wherein the amplifier mode comprises at least one of a linear integral correlation to the magnitude of the input light stimulus and a logarithmic correlation to the magnitude of the input light stimulus,
   wherein the amplifier mode comprises a logarithmic correlation to the magnitude of the input light stimulus in response to the magnitude of the input light stimulus causing an output voltage on the output node to exceed $V_{CROSS}$ and a linear function of the magnitude of the input light stimulus integrated over a first period in response to the magnitude of the input light stimulus causing an output voltage on the output node to not exceed $V_{CROSS}$.

2. The photosensitive pixel with gain stage of claim 1, the input light stimulus comprising collimated light.

3. The photosensitive pixel with gain stage of claim 1, the photodetector module comprising:
   a detector configured to detect the magnitude of the input light stimulus;
   a bias control amplifier connected to the detector; and
   a bias control transistor connected to the bias control amplifier and configured to induce the detection current into the detection node in response to the magnitude of the input light stimulus.

4. The photosensitive pixel with gain stage according to claim 1, wherein the detector comprises a reverse biased light sensitive diode comprising an anode and a cathode.

5. The photosensitive pixel with gain stage according to claim 4,
   wherein the bias control amplifier comprises an operational amplifier comprising a first input, a second input, and an output,
   wherein the bias control transistor comprises a p-channel field effect transistor comprising a gate, a drain, and a source,
   wherein the gate is connected to the output of the bias control amplifier,
   wherein the source is connected to the anode of the reverse biased light sensitive diode and the first input of the bias control amplifier, and
   wherein a reference voltage, $V_{REF}$, is connected to the second input of the bias control amplifier.

6. The photosensitive pixel with gain stage according to claim 5, the mode threshold control module comprising:
   a current integrator configured to integrate an output current and produce an output voltage on the output node;
   a logarithmic current amplifier comprising a field effect transistor comprising a source connected to a reference voltage, $V_{log}$, a gate connected to the source, and a drain connected to the output node; and
   an integration reset switch connected in series between a reference voltage, $V_{RESET}$, and the output node.

7. The photosensitive pixel with gain stage according to claim 6, further comprising a cascode amplifier comprising a field effect transistor comprising a gate connected to a reference voltage, $V_{CASC}$, a drain connected to the mirrored current node, and a source connected to the output node.

8. The photosensitive pixel with gain stage according to claim 6, wherein the current integrator comprises a capacitor.

9. The photosensitive pixel with gain stage according to claim 1, wherein the current mirror module comprises two n-channel field effect transistors.

10. A photosensitive pixel with gain stage comprising:
a photodetector module configured to receive an input light stimulus and induce a detection current into a detection node in response to a magnitude of the input light stimulus;
a current mirror module comprising a mirrored current node and configured to induce a mirrored current on the mirrored current node in response to the detection current;
a mode threshold control module comprising an output node and configured to induce a current on the output node corresponding to a combination of the magnitude of the input light stimulus and an amplifier mode;
wherein the photodetector module comprises:
a detector configured to detect the magnitude of the input light stimulus;
a bias control amplifier connected to the detector; and
a bias control transistor connected to the bias control amplifier and configured to induce the detection current into the detection node in response to the magnitude of the input light stimulus;
wherein the detector comprises a reverse biased light sensitive diode comprising an anode and a cathode,
wherein the amplifier mode comprises at least one of a linear integral correlation to the magnitude of the input light stimulus and a logarithmic correlation to the magnitude of the input light stimulus, and
wherein the current mirror module comprises:
a first current mirror transistor; and
a second current mirror transistor.

11. The photosensitive pixel with gain stage according to claim 10, wherein the bias control amplifier comprises an operational amplifier comprising a first input, a second input, and an output,
wherein the bias control transistor comprises a p-channel field effect transistor comprising a gate, a drain, and a source,
wherein the gate is connected to the output of the bias control amplifier,
wherein the source is connected to the anode of the reverse biased light sensitive diode and the first input of the bias control amplifier, and
wherein a reference voltage, $V_{REF}$, is connected to the second input of the bias control amplifier.

12. The photosensitive pixel with gain stage according to claim 11, wherein the amplifier mode comprises the logarithmic correlation to the magnitude of the input light stimulus in response to the magnitude of the input light stimulus causing an output voltage on the output node to exceed $V_{CROSS}$.

13. The photosensitive pixel with gain stage according to claim 12, wherein at least one of the first current mirror transistor and the second current mirror transistor comprises an n-channel field effect transistor.

* * * * *